(12) United States Patent
Then et al.

(10) Patent No.: US 9,660,067 B2
(45) Date of Patent: May 23, 2017

(54) III-N TRANSISTORS WITH EPITAXIAL LAYERS PROVIDING STEEP SUBTHRESHOLD SWING

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/120,732

(22) PCT Filed: Mar. 25, 2014

(86) PCT No.: PCT/US2014/031741
§ 371 (c)(1),
(2) Date: Aug. 22, 2016

(87) PCT Pub. No.: WO2015/147802
PCT Pub. Date: Oct. 1, 2015

(65) Prior Publication Data
US 2016/0365435 A1    Dec. 15, 2016

(51) Int. Cl.
*H01L 29/778*    (2006.01)
*H01L 29/66*    (2006.01)
(Continued)

(52) U.S. Cl.
CPC ........ *H01L 29/7786* (2013.01); *H01L 29/045* (2013.01); *H01L 29/0847* (2013.01);
(Continued)

(58) Field of Classification Search
None
See application file for complete search history.

(56) References Cited

U.S. PATENT DOCUMENTS

| 6,841,809 B2* | 1/2005 | Fareed | H01L 29/66462 257/183 |
| 7,777,252 B2* | 8/2010 | Sugimoto | H01L 29/66462 257/192 |

(Continued)

FOREIGN PATENT DOCUMENTS

TW    200830550    7/2008

OTHER PUBLICATIONS

International Search Report and Written Opinion mailed Dec. 26, 2014, for PCT Patent Application No. PCT/US14/31741.
(Continued)

*Primary Examiner* — Minh-Loan Tran
(74) *Attorney, Agent, or Firm* — Green, Howard & Mughal, LLP

(57) ABSTRACT

III-N transistors with epitaxial semiconductor heterostructures having steep subthreshold slope are described. In embodiments, a III-N HFET employs a gate stack with balanced and opposing III-N polarization materials. Overall effective polarization of the opposing III-N polarization materials may be modulated by an external field, for example associated with an applied gate electrode voltage. In embodiments, polarization strength differences between the III-N materials within the gate stack are tuned by composition and/or film thickness to achieve a desired transistor threshold voltage ($V_t$). With polarization strengths within the gate stack balanced and opposing each other, both forward and reverse gate voltage sweeps may generate a steep sub-threshold swing in drain current as charge carriers (Continued)

are transferred to and from the III-N polarization layers and the III-N channel semiconductor.

20 Claims, 8 Drawing Sheets

(51) Int. Cl.
*H01L 29/423* (2006.01)
*H01L 29/04* (2006.01)
*H01L 29/08* (2006.01)
*H01L 29/20* (2006.01)

(52) U.S. Cl.
CPC ...... *H01L 29/2003* (2013.01); *H01L 29/4236* (2013.01); *H01L 29/66431* (2013.01); *H01L 29/66446* (2013.01); *H01L 29/66462* (2013.01); *H01L 29/778* (2013.01); *H01L 29/7783* (2013.01); *H01L 29/7787* (2013.01)

(56) References Cited

U.S. PATENT DOCUMENTS

| | | |
|---|---|---|
| 2008/0308813 A1 | 12/2008 | Suh et al. |
| 2010/0187569 A1 | 7/2010 | Renaud |
| 2012/0061680 A1 | 3/2012 | Lee et al. |
| 2012/0086049 A1 | 4/2012 | Hwang et al. |
| 2013/0141156 A1 | 6/2013 | Teo et al. |
| 2013/0271208 A1* | 10/2013 | Then ............... H01L 25/072 327/541 |
| 2013/0313561 A1 | 11/2013 | Suh |
| 2014/0253241 A1* | 9/2014 | Lee ............... H03F 3/193 330/277 |

OTHER PUBLICATIONS

International Preliminary Report on Patentability for PCT/US14/31741 mailed Oct. 6, 2016, 8 pages.
Notification of Grant and Search Report mailed Jul. 28, 2016, for TW Patent Application No. 104104566, 4 pages.

* cited by examiner

III-N TRANSISTORS WITH EPITAXIAL LAYERS PROVIDING STEEP SUBTHRESHOLD SWING

CLAIM OF PRIORITY

This application is a National Phase Application of, and claims priority to PCT Patent Application Serial No. 25 Mar. 2014, filed on PCT/US14/31741 and titled "III-N TRANSISTORS WITH EPITAXIAL LAYERS PROVIDING STEEP SUBTHRESHOLD SWING", which is incorporated by reference in its entirety.

TECHNICAL FIELD

Embodiments of the invention generally relate to III-N transistors, and more particularly pertain to field effect transistors employing heterostructures for steep sub-threshold swing (SS).

BACKGROUND

Demand for integrated circuits (ICs) in portable electronic applications has motivated energy-efficient transistors. It is advantageous to reduce the operating voltage of transistors required to achieve a threshold minimum on/off drain current ratio. Subthreshold slope (SS) (expressed in mV/decade) characterizes a gate voltage required to change a drain current by one order of magnitude. In traditional FET technologies, SS has a thermal limit of approximately 60 mV/dec at room temperature (20° C.). Recently, in an effort to improve SS beyond 60 mV/dec, there has been renewed interest in ferroelectric FETs that employ a ferroelectric material (e.g., $BaTiO_3$) within a gate stack. Internal polarization of the ferroelectric may act to "step-up" the gate potential across the ferroelectric layer to a semiconductor channel of the transistor, to increase effective capacitance and a lower operating voltage. Because of effective capacitance is increased, such devices are sometimes described as displaying a "negative capacitance effect." Ferroelectric films however remain difficult to grow and have thus far have needed to be more than 100 nm thick to display a negative capacitance effect.

III-N heterostructure field effect transistors (HFET), such as high electron mobility transistors (HEMT) and metal oxide semiconductor (MOS) HEMT, employ a semiconductor heterostructure with one or more heterojunction, for example at an interface of a GaN semiconductor and another III-N semiconductor alloy, such as AlGaN or AlInN. GaN-based HFET devices benefit from the relatively wide band-gap (~3.4 eV), enabling higher breakdown voltages than Si-based MOSFETs. III-N HFETs that display steeper sub-threshold swings would advantageously improve power efficiency of such devices for mobile applications.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
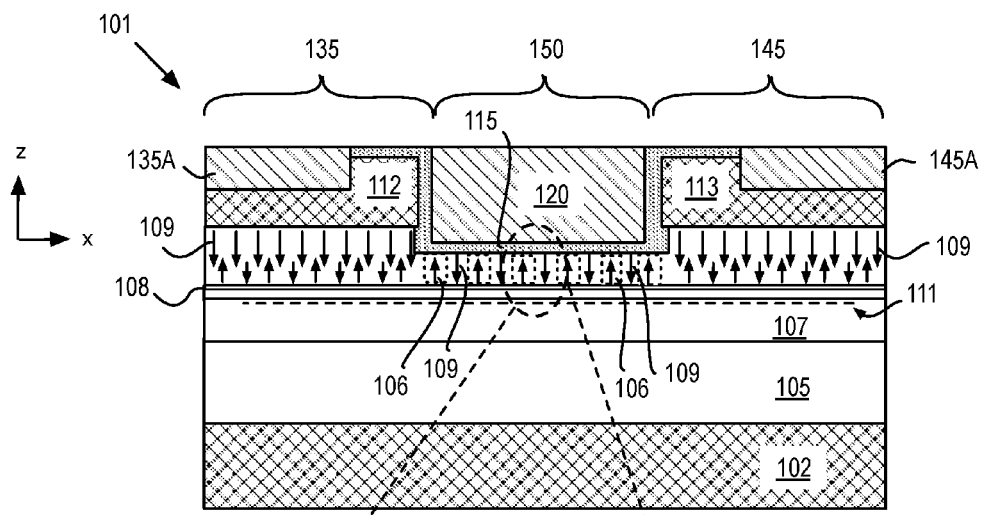
FIG. 1A is a cross-sectional view of a HFET with a gate stack including balanced and opposing III-N polarization materials configured to achieve a steep SS, in accordance with an embodiment.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

III-N transistors with steep sub-threshold slope and the associated epitaxial semiconductor heterostructures are described herein. Embodiments herein harness the large piezoelectric and spontaneous polarization fields possible with III-N materials to enhance the electrostatic control of the transistor channel through the negative capacitance effect and achieve a FET with a SS less than 60 mV/decade.

In embodiments, a III-N HFET employs a gate stack with balanced and opposing III-N polarization materials. Overall effective polarization of the opposing III-N polarization materials is modulated by an external field, for example associated with an applied gate electrode voltage. In embodiments, polarization strength differences between the III-N materials within the gate stack are tuned by composition and/or film thickness to achieve a desired transistor threshold voltage ($V_t$). With polarization strengths within the gate stack balanced and opposing each other, both forward and reverse gate voltage sweeps may generate a steep SS response in drain current as charge carriers are transferred to and from the polarization layers and the III-N channel semiconductor.

FIG. 1A is a cross-sectional view of HFET 101. In this exemplary embodiment, HFET 101 is more specifically a MOS device, and may be categorized as a MOS-HEMT in further reference to the high electron mobility achievable in an undoped channel semiconductor, such as GaN. The III-N materials in HFET 101 are disposed over a substrate 102, which may be substantially monocrystalline with a predetermined crystal orientation. Substrate 102 may be a variety of materials, including, but not limited to, GaN, SiC, sapphire, and silicon. Silicon is advantageous for monolithic integration of HFET 101 with conventional silicon CMOS and for such embodiments the substrate crystallographic orientation may be any of (100), (111), (110). Other crystallographic orientations are also possible and a range of miscut (e.g., 4-11°) may be utilized for better lattice matching between substrate 102 and an overlying semiconductor buffer 105. Semiconductor buffer 105 may have a wide variety of compositions and structures designed to confine lattice defects. In an embodiment, semiconductor buffer 105 is a first III-N layer interfacing with a non-III-N substrate 102. In one such embodiment, semiconductor buffer 105 includes one or more GaN material layer.

Source 135, and drain 145 include contact metals 135A, 145A, which may be of an ohmic metal, such as, but not limited to, a Ti/Au alloy. Electrically coupled to metals 135A, 145A are impurity doped source semiconductor regions 112, 113, respectively. The impurity doped semiconductor regions 112, 113 may be, for example, a low bandgap group III-N material, such as $In_xGa_{1-x}N$ and InN, for low resistance, or may be simply n-type (e.g., Si-doped) GaN.

HFET 101 includes a gate stack 150 disposed between a source 135 and drain 145. Gate stack 150 includes a gate electrode with a workfunction metal that is advantageously a mid-gap metal, such as, but not limited to TiN, or slightly p-type, such as, but not limited to a Ni/Au alloy. Gate electrode 120 electrostatically couples to a channel semiconductor 107 through the field effect. While embodiments herein may utilize a Schottky gate architecture, HFET 101 illustrates an exemplary MOS architecture where gate stack 150 includes a gate dielectric 115. Such MOS embodiments offer advantageously lower gate leakage than Schottky architectures. Gate dielectric 115 may also isolate the gate electrode 120 from source and drain 135, 145, as depicted in FIG. 1A. Gate dielectric 115 is advantageously of a material that has a bulk dielectric constant of 7, or more. In one advantageous embodiment, gate dielectric 115 is $Al_2O_3$. Other dielectric materials, such as, but not limited to group III-ON, and other high-k dielectrics such as $Gd_2O_3$, $HfO_2$, $Ta_2O_5$, $ZrO_2$, high-K metal silicates such as HfOSiO, $TaSi_yO_x$, AlSiO, and other high-K oxynitrides such as HfON, AlON, ZrSiON, HfSiON may also be suitable as gate dielectric 115.

Gate stack 150 further includes a plurality of III-N polarization materials 106, 109 proximate to III-N channel semiconductor 107. In the exemplary embodiment depicted, polarization materials 106, 109 are spaced apart from channel semiconductor 105 by III-N spacer 108, which helps confine the 2DEG wave function within the channel semiconductor 107 to reduce carrier interface scattering, etc. Spacer 108 may be highly polar, but is significantly thinner than the film thickness of either polarization material 106, 109. In one embodiment, for example, spacer 108 is AlN having a thickness less than 2 nm, and advantageously about 1 nm.

Channel semiconductor 107 is disposed below gate stack 150 and over semiconductor buffer 105. Channel semiconductor 107 is epitaxial to semiconductor buffer 105 with the crystal orientation of the two materials therefore aligned. III-N polarization materials 106, 109 are likewise epitaxial to channel semiconductor 107 such that all semiconductor films within gate stack 150 are substantially single-crystalline. Channel semiconductor 107 may be any III-N material having a piezoelectric and spontaneous polarization strength distinct from III-N polarization materials 106, 109 such that, under certain circumstances, a two dimensional electron gas (2DEG) 111 is formed. Source and drain 135, 145 are electrically coupled through 2DEG 111. In exemplary embodiments, channel semiconductor 107 comprises GaN. In one such embodiment, channel semiconductor 107 is the binary alloy GaN, and is substantially undoped to have a carrier mobility of 1100 cm$^2$/V*s, or more.

Channel semiconductor 107 and polarization materials 106, 109 are all coupled to gate electrode 120 through gate dielectric 115. Depending on the relative polarization strengths of channel semiconductor 107 and polarization materials 106, 109, 2DEG 111 may be present in the absence of an externally applied field (e.g., depletion mode) or the 2DEG 111 may be present only with the addition of an externally applied field (e.g., enhancement mode). The point where 2DEG 111 forms within gate stack 150 corresponds to $V_t$. In embodiments, III-N polarization materials 106 and 109 within gate stack 150 have balanced and opposing polarizations in the absence of an external field. Where opposing polarizations are balanced, the overall effective polarization of materials 106, 109 can be modulated between the two opposing polarizations through application of an external field and $V_t$ may be targeted at 0V. In further embodiments, opposing polarizations of III-N polarization materials 106 and 109 beyond gate stack 150 (e.g., within source/drain regions 135, 145) are not balanced. In certain such embodiments, unbalanced polarization within source/drain regions 135, 145 ensures a 2DEG is maintained in these regions over a wide transistor operating range.

Figure 1B:
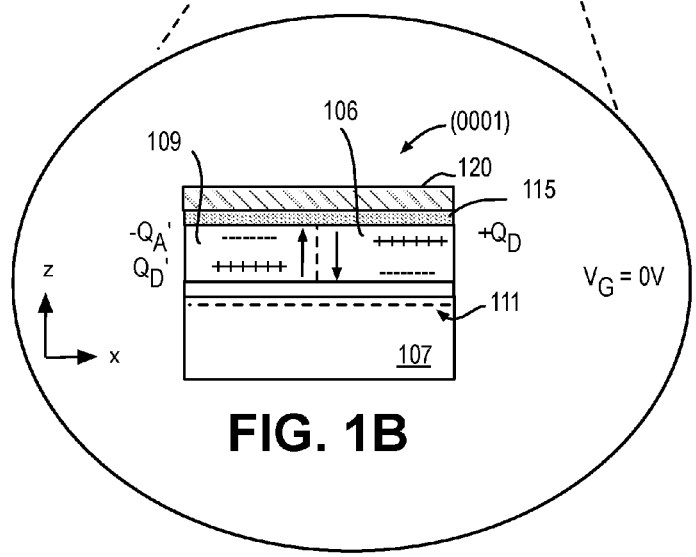
FIG. 1B is an expanded view of a gate stack in the HFET illustrated in FIG. 1A, in accordance with an embodiment.
Figure 1C:
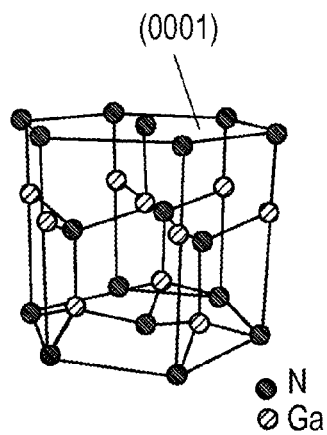
FIG. 1C is an isometric view of a Ga-polar GaN crystal, in accordance with an embodiment.

In the exemplary embodiment illustrated in FIG. 1A, III-N polarization materials 106 and 109 are on a same side of channel semiconductor 107, and more particularly occupy adjacent lateral regions or islands interfacing spacer 108. Arrows in FIG. 1A illustrate the opposing polarization field polarities of the III-N polarization materials 106, 109. FIG. 1B is an expanded view of two adjacent III-N polarization materials 106, 109 within gate stack 150. While outside of gate stack 150, polarization material 109 is dominant, within gate stack 150 there are locales of polarization dipole charges with opposing polarity. Donor-like and acceptor-like states are denoted as $Q_D$, $Q_A$, respectively. For the state illustrated in FIG. 1B where no external electric field is applied (e.g., $V_g$=0V), one of the polarization materials (e.g., polarization material 106) has a polarization field polarity that removes negative charge from a Ga-polar interface of channel semiconductor 107. The other of the polarization materials (e.g., polarization material 109) has a polarization field polarity that places negative charge at a Ga-polar interface of channel semiconductor 107. For reference, the GaN wurtzite crystal structure is depicted in FIG. 1C. GaN and other group III-nitrides described herein are notable in that their wurtzite crystalline form lacks inversion symmetry, and more particularly the {0001} planes are not equivalent. One of the {0001} planes is typically referred to as the Ga-face (+c polarity) and the other referred to as the N-face (−c polarity). Often for planar group III-N devices as illustrated in FIG. 1A, one or the other of {0001} planes is more proximate a substrate surface and so may be referred to as Ga polarity (+c) if the three bonds of the Ga (or other group III element) point towards the substrate (e.g., substrate 102) or N polarity (−c) if the three bonds of the Ga (or other group III element) point away from the substrate.

Figure 1D:
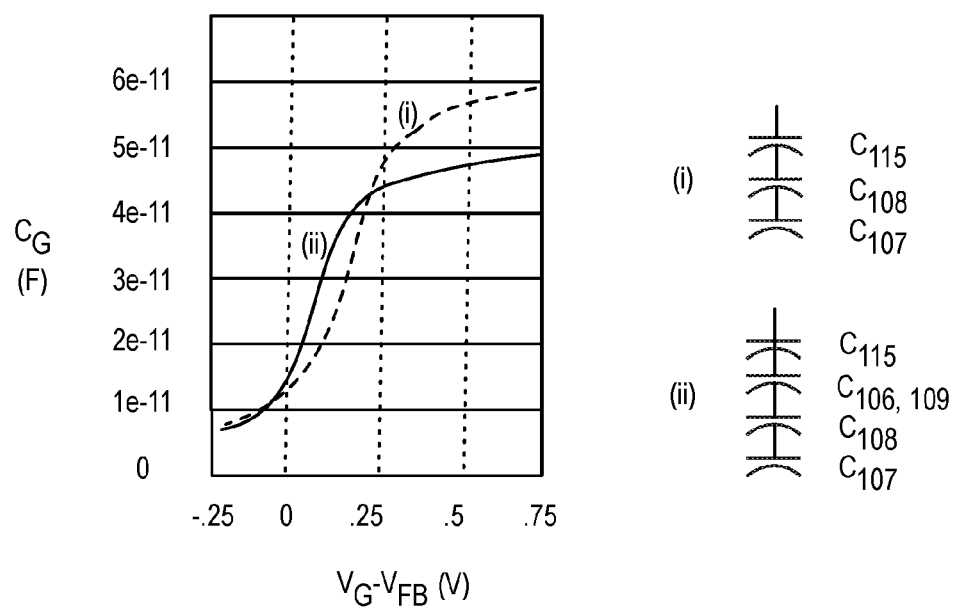
FIG. 1D is a graph illustrating a negative capacitance effect observed in the HFET structure of FIG. 1A, in accordance with an embodiment.

In response to a negative gate bias voltage during transition operation, electrons begin to populate 2DEG 111, and although not bound by theory, the inventors currently understand additional electrons to be transferred to 2DEG 111 from filled acceptor states ($Q'_A$) as they are repelled by the gate potential. These additional electrons are thought to be responsible for enhancing surface charge potential ($\phi$), and driving an order of magnitude change in current at the drain at 20° C. in response to a bias voltage of the gate electrode changing by less than 60 mV. Where the $dV_G/d\phi$ is reduced to below 1.0, negative capacitance is observed. Negative capacitance is further illustrated in FIG. 1D where gate capacitance ($C_G$) measured at 20° C. and 1 MHz perturbation is plotted in dashed line for a control HFET lacking the polarization materials 106, 109. For this control treatment (i), gate dielectric 115 is disposed directly on spacer 108 and the series capacitance includes the semiconductor channel 107 ($C_{107}$), spacer 108 ($C_{108}$), and gate dielectric 115 ($C_{115}$). $C_G$ is also plotted in solid line as treatment (ii) for HFET 101 with the series capacitance further including the effective capacitance of polarization layers 106, 109 ($C_{106,109}$). For voltages over flatband, $C_G$ is decreased by presence of polarization layers 106, 109. However, for small $V_G$, $C_G$ is actually higher for HFET 101 that includes polarization layers 106, 109 despite their film thickness adding into gate stack 150.

In certain advantageous embodiments, III-N polarization materials 106, 109 are single crystalline (i.e., not separate domains with a grain boundary separating them), but have distinct alloy composition. For example, polarization material 106 may be In-rich with a polarization field polarity that removes negative charge from the Ga-polar interface of channel semiconductor 107 while polarization material 109 is Al-rich with a polarization field polarity that places negative charge at the Ga-polar interface of channel semiconductor 107 in the absence of an external field. In the embodiment illustrated in FIG. 1A and FIG. 1B, this compositional modulation may occur over a lateral distance (xdimension) of less than 10 nm and advantageously between 2 nm and 5 nm.

In one embodiment, the z-thickness of polarization layers 106, 109 within gate stack 150 is less than 3 nm. One technique for forming opposing polarization materials through lateral composition modulation is with a metal organic chemical vapor deposition (MOCVD) process performed between 800° C. and 1000° C. In one such embodiment, precursor gases are introduced to target a $Al_{0.83}In_{0.17}N$ composition at a steady state growth temperature below 900° C. If laterally uniform, this target film has polarization uniformly oriented so as to place negative charge at the Ga-polar interface of channel semiconductor 107 in the absence of an external field. However, lateral compositional modulation has been found to occur at higher growth temperatures (e.g., between 800° C. and 1000° C.), particularly when grown on an AlN spacer 108, and more particularly when grown in-situ with AlN spacer 108 grown at a temperature of at least 900° C. An AlInN film with InN-rich material 106 laterally adjacent to AlN-rich material 109 may be formed during at least a transition period between growth conditions of the AlN spacer 108 and $Al_{0.83}In_{0.17}N$ growth conditions having a lower temperature (e.g., 700 C). AlInN growth can either be terminated after completing this transition period or may be continued indefinitely to reach a z-thickness over 4 nm, and advantageously between 7 nm and 20 nm if stabilized growth conditions can maintain the desired lateral composition modulation.

In embodiments where growth conditions cannot maintain lateral composition modulation indefinitely, growth overburden having a substantially singular polarization field polarity (e.g., as is illustrated in the source/drain 135, 145) may be recess-etched or polished back to some threshold thickness below which there are two polarization materials of opposing polarity (e.g., less than 3 nm). The polarization materials 106, 109 with laterally modulated polarization field polarity illustrated in FIGS. 1A, 1B may also be achieved in thicker films (e.g., 7 nm-20 nm) through the use of lateral epitaxial overgrowth techniques. For example, lateral growth on a III-N material sidewall having, for example, a 20 nm z-dimension sidewall may be performed with growth conditions varied between a predetermined InN-rich composition and a predetermined AlN-rich composition using 5-10 nm growth cycles.

In embodiments, a III-N HFET includes a plurality of polarization material layers having opposing and balanced polarization field polarity. For such embodiments, rather than the lateral compositional modulation illustrated in FIGS. 1A and 1B, compositional modulation is along a growth axis normal to the growth substrate. Embodiments with a plurality of polarization material layers include at least two polarization films, each of which has a fixed dominant polarity and may therefore be of any desired thickness (i.e., not limited to a thickness corresponding to a transitional growth environment). The composition and film thicknesses of the polarization material layers may be tuned such that their polarization strengths are balanced and their field polarities oppose each other in the absence of an external electric field. The overall effective polarization within a transistor gate stack is then subject to modulation by an external electric field. Embodiments with multiple polarization layers advantageously offer additional degrees of freedom in HFET epitaxy architecture, one of which is the location of each polarization layer relative to the channel semiconductor. Polarization layer composition and polarization layer z-thickness are two more additional degrees of freedom for such HFET epitaxial structures, which may be utilized to tune $V_t$ to a target voltage that allows a steep SS slope regardless of gate voltage sweep direction.

Figure 2A:
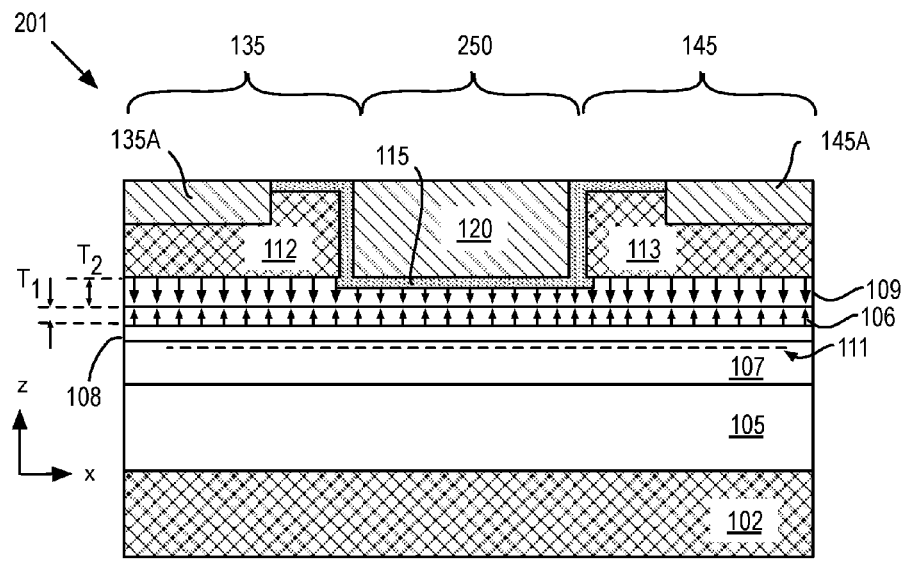
FIG. 2A is a cross-sectional view of a HFET with a gate stack that includes balanced and opposing III-N polarization material layers configured to achieve a steep sub-threshold slope, in accordance with an embodiment.
Figure 3A:
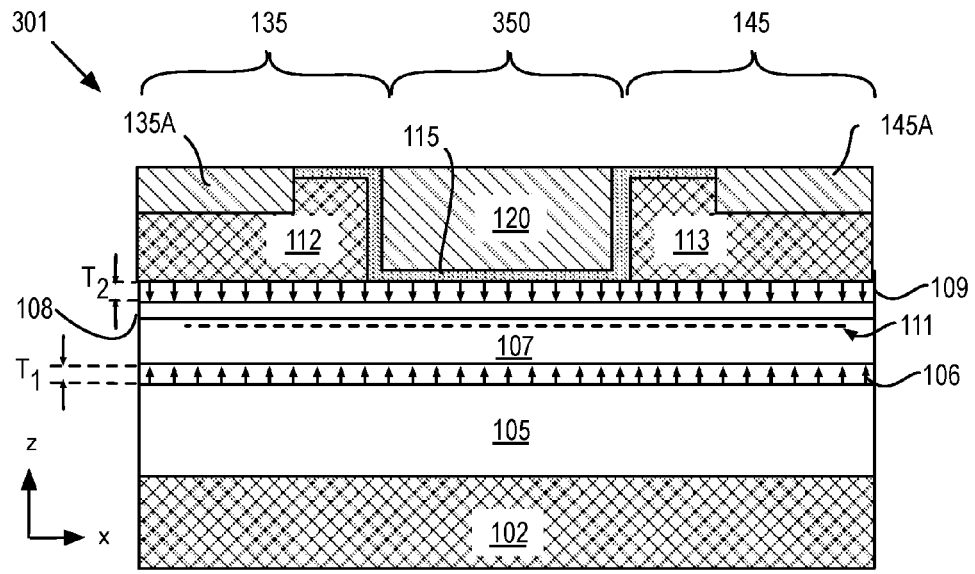
FIG. 3A is a cross-sectional view of a HFET with a gate stack that includes balanced and opposing III-N polarization material layers configured to achieve a steep sub-threshold slope, in accordance with an embodiment.

FIG. 2A is a cross-sectional view of HFET 201 with a gate stack 250 that includes balanced and opposing III-N polarization material layers in accordance with an embodiment where first and second III-N polarization materials 106, 109 are both layers disposed over the Ga-polar interface of channel semiconductor 107. FIG. 3A is a cross-sectional view of HFET 301 with a gate stack 350 that includes balanced and opposing III-N polarization material layers in accordance with an embodiment where polarization material 109 is a layer disposed over the Ga-polar interface of channel semiconductor 107 and channel semiconductor 107 is disposed over a Ga-polar interface of a layer of III-N polarization material 106.

Referring first to FIG. 2A, HFET 201 includes gate electrode 120, gate dielectric 115, source and drain 135, 145, substrate 102, and buffer layer 105 substantially as described for HFET 101. Channel semiconductor 107 and spacer 108 may also have any of the properties described above in the context of HFET 101. In one exemplary embodiment, channel semiconductor 107 is an undoped GaN layer with a thickness of 10 nm, or more, and spacer 108 is AlN of less than 2 nm. III-N polarization materials 106, 109 are disposed over channel semiconductor 107. As illustrated, polarization material 106 has a first polarity that removes charge from the Ga-face of channel semiconductor 107 while polarization material 109 has the opposite polarity. In the exemplary embodiment, III-N polarization material 106 has a layer thickness $T_1$ of at least 4 nm, and advantageously between 7 nm and 20 nm within gate stack 250. Within gate stack 250, III-N polarization material 109 likewise has a layer thickness $T_2$ of at least 4 nm, and advantageously between 7 nm and 20 nm. These greater thicknesses ensure any transition regime that may have compositional modulation is exceeded and there is one highly dominant polarization field polarity in each polarization material layer. In further embodiments, $T_2$ is within 10% of $T_1$ within gate stack 250.

Polarization material 109 is disposed between polarization material 106 and channel semiconductor 107. More specifically, polarization material 106 is a bottom polarization layer interfacing with the Ga-face of channel semiconductor 107 and polarization material 109 forms a top polarization layer interfacing with the Ga-face of polarization material 106. While an alternate stacking of polarization materials 106, 109 is possible, the illustrated ordering permits III-N polarization material 106 to have a predetermined thickness $T_1$ with polarization material 109 having a predetermined thickness $T_2$ within gate stack 250 that best balances the polarization field strength of polarization material 106. Polarization material 109 may further have a greater thickness $T_2$ beyond the gate stack 250 that ensures high charge carrier density within 2DEG in source/drain regions 135/145. The variation in $T_2$ may be achieved, for example, through a gate recess process, which may thin polarization material 109 within gate stack 205 as needed to balance the opposing polarization field polarity of III-N polarization material 106. In further embodiments, the film thickness $T_2$ is smaller within gate stack 250 by at least a few nanometers than it is within source/drain regions 135/145.

Referring next to FIG. 3A, HFET 301 includes gate electrode 120, gate dielectric 115, source and drain 135, 145, substrate 102, and buffer layer 105 substantially as described for HFET 101 and HFET 201. Channel semiconductor 107 and spacer 108 may also have any of the properties described above in the context of HFET 101 and HFET 201. In one exemplary embodiment, channel semiconductor 107 is an undoped GaN layer with a thickness of at least 7 nm and advantageously 10 nm, or more. In exemplary embodiments, spacer 108 is AlN of less than 2 nm. Channel semiconductor 107 is disposed between polarization material 106 and polarization material 109. More specifically, channel semiconductor 107 forms a heterojunction with the Ga-polar interface of the III-N polarization material 106, and polarization material 109 forms a top polarization layer interfacing with the Ga-face of channel semiconductor 107. The epitaxial architecture of HFET 301 has an advantage over that of HFET 201 in that a GaN channel semiconductor 107 may further serve to transition from the lattice spacing of polarization material 106 to that of polarization layer 109. Each polarization layer may then be subject to lattice mismatch to GaN, which may have a lattice constant intermediate between the polarization layer lattice constants.

Figure 2B:
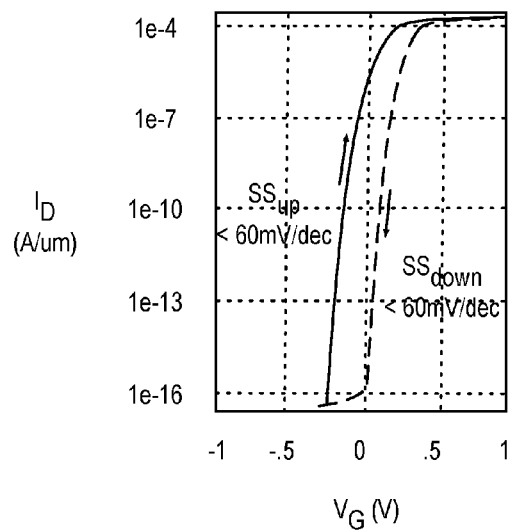
FIG. 2B is a graph of sub-threshold performance of the HFET illustrated in FIG. 2A, in accordance with an embodiment.
Figure 3B:
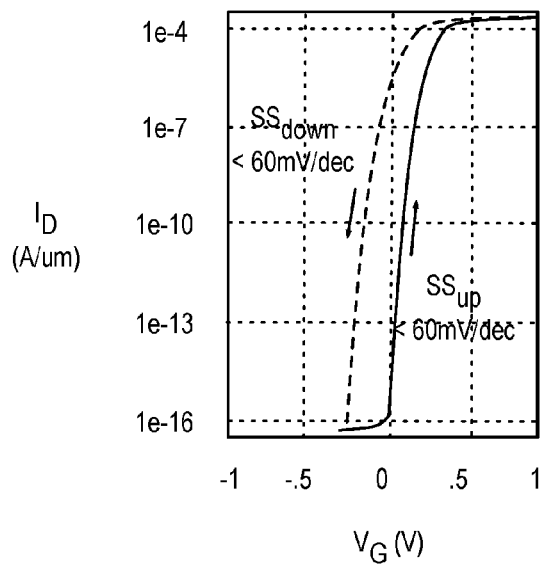
FIG. 3B is a graph of sub-threshold performance of the HFET illustrated in FIG. 3A, in accordance with an embodiment.

In HFET 301, polarization material 106 again has a first polarity that removes negative charge from the Ga-face of channel semiconductor 107. Polarization material 109 has the opposite polarity and places negative charge on the Ga-face of channel semiconductor 107. As described for HFET 201, the polarization material film thicknesses $T_1$, and $T_2$ are selected to balance polarization strength between the opposing fields within gate stack 350, and are therefore a function of the polarization material compositions. In embodiments, polarization material layer thicknesses $T_1$ and $T_2$ are both at least 4 nm, and advantageously between 7 nm and 20 nm, to ensure any transition regime that may have compositional modulation is exceeded and there is one highly dominant a polarization field polarity in each polarization film. In further embodiments, $T_2$ is within 10% of $T_1$ within gate stack 350. In the exemplary embodiment illustrated in FIG. 3A, gate electrode 120 is not recessed, with polarization material 109 forming a layer having a fixed thickness of $T_2$ both within gate stack 350 and within source/drain 135/145. In alternative embodiments however, gate electrode 120 may be recessed (e.g., as shown in FIG. 2A) for the sake of balancing polarization fields within gate stack 350 while still ensuring 2DEG 111 extends into source/drain 135/145.

Where opposing polarization fields have well-balanced strengths (i.e., having strengths that are substantially equal) within a gate stack, the overall effective polarization can be modulated between the two opposing polarizations through application of an external field, for example resulting from application of a bias voltage on the gate electrode. For balanced opposing polarization fields, a steep subthreshold swing can be achieved in both positive and negative sweeps of gate voltage. FIG. 2B is a graph of sub-threshold performance of HFET 201, in accordance with such an embodiment. FIG. 3B is a graph of sub-threshold performance of HFET 301, in accordance with another such embodiment. Noting the reduction $dV_G/d\phi$ corresponds to transfer of electrons between filled states within the III-N polarization materials 106, 109 and the channel semiconductor 107, a small hysteresis may be expected with $V_t$ varying as a function of the direction the gate electrode bias voltage sweeps by no more than 200 mV. With the thicknesses and composition of polarization materials 106, 109 properly selected for balanced polarization strengths, III-N polarization materials 106, 109 drive an order of magnitude increase in drain current at 20° C. in response to gate bias voltage increasing by less than 60 mV towards 0V (solid line in FIG. 2B and FIG. 3B). The materials 106, 109 also drive an order of magnitude decrease in drain current at 20° C. in response to gate bias voltage decreasing by less than 60 mV towards 0V (dashed line in FIG. 2B and FIG. 3B). In other words, with $V_t$ centered at 0 volts, sub-threshold slope exceeds the thermal limit in both off-to-on switching and on-to-off switching for both HFET 201 and HFET 301. Where polarization strengths of the opposing polarities are not balanced, a degraded sub-threshold sloped (e.g., >60 mV/dec) may be observed in at least one of the voltage sweep directions.

While $V_t$ is centered at 0 volts for both HFET 201 and HFET 301, difference in the epitaxial architectures between HFET 201 and HFET 301 result in different $I_DV_G$ characteristics. In HFET 201, when an increasing external gate potential of negative polarity is applied, the negative charge in the channel increases by means of a charge transfer from the interface of layers 106 and 109 to channel semiconductor 107, causing the channel potential to enhance more than would have been possible due to the increase in the applied gate potential alone. This results in a voltage step-up effect, i.e., negative capacitance effect, and a subthreshold swing of less than 60 mV/decade on the sweep up. The opposite occurs when a decreasing external gate potential of positive polarity is applied. In HFET 301, when a decreasing external gate potential of negative polarity is applied, the negative charge in the channel decreases by means of a charge transfer from the channel to the interface layer 106, causing the channel potential to deplete more than would have been possible due to the decrease in the applied gate potential alone. This results in a subthreshold swing of less than 60 mV/decade on the sweep down. The opposite occurs when an increasing external gate potential of positive polarity is applied.

Figure 4:
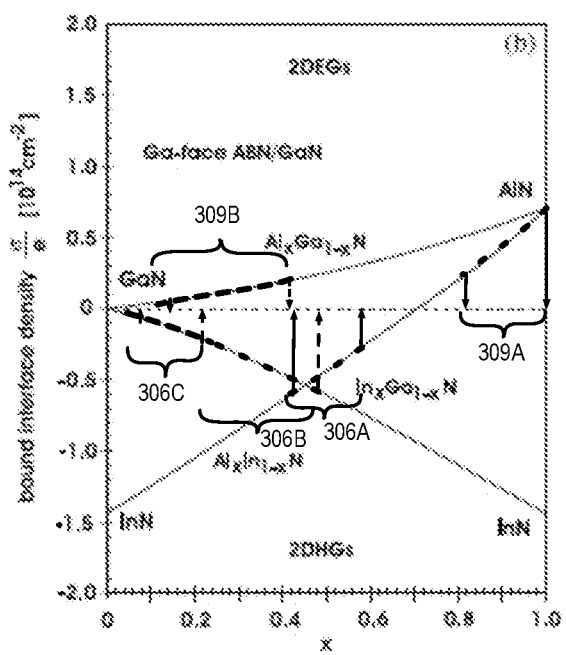
FIG. 4 is a graph of interface potential as a function of III-N composition and further indicating III-N polarization layer compositions that may be utilized together in the HFET illustrated in FIG. 1A, FIG. 2A or FIG. 3A, in accordance with embodiments.

In embodiments, III-N polarization layer 106 is an InGaN or AlInN alloy with III-N polarization layer 109 being an alloy of either AlInN or AlGaN. The composition of each material is constrained to balance polarization strengths and achieve opposing polarities. FIG. 4 is a graph of bound interface potential as a function of III-N composition highlighting III-N polarization layer compositions that may combined in an epitaxial structure in accordance with embodiments of HFET 101, or HFET 201, or HFET 301. In FIG. 4, three exemplary ranges of alloy fractions with positive Ga-face/GaN interface density suitable for polarization layer 106 are highlighted as 306A, 306B, and 306C. Two exemplary ranges of alloy fractions with negative Ga-face/GaN interface density suitable for polarization layer 109 are similarly highlighted as 309A and 309B. The compositional ranges illustrated in FIG. 4 may be combined to form three exemplary HFET epitaxial structures A, B, and C listed in Table 1, in accordance with embodiments.

TABLE 1

| Epitaxial Structure | Polarization Layer 106 | Polarization Layer 109 |
|---|---|---|
| A | $Al_xIn_{1-x}N$(x: 0.8-1) | $Al_xIn_{1-x}N$(x: 0.6.-0.4) |
| B | $Al_xIn_{1-x}N$(x: 0.8-1) | $In_xGa_{1-x}N$(x: 0.2.-0.5) |
| C | $Al_xGa_{1-x}N$(x: 0.1-0.4) | $In_xGa_{1-x}N$(x: 0.03.-0.2) |

As shown in FIG. 4 and Table 1, polarization layer 106 may be $Al_xIn_{1-x}N$ with x between 0.6 to 0.4 (306A), or may be $In_xGa_{1-x}N$ with x between 0.2 to 0.5 (306B), while polarization layer 109 is $Al_xIn_{1-x}N$, with x between 0.8 and 1 (309A). In either of these embodiments, polarization layer 109 may be $Al_{0.83}In_{0.17}N$ for advantageous lattice match with GaN. In the first of these embodiments, smaller fractions of Al in the $Al_xIn_{1-x}N$ polarization layer 106 may be balanced with larger fractions of Al in the $Al_xIn_{1-x}N$ polarization layer 109. In the second of these embodiments, larger fractions of Al in the $In_xGa_{1-x}N$ polarization layer 106 may be balanced with larger fractions of Al in the $Al_xIn_{1-x}N$ polarization layer 109. In either embodiment, a better match between polarization layer thicknesses is possible where the negative and positive bound interface densities are more matched.

In the third embodiment illustrated by FIG. 4 and listed in Table 1, polarization layer 106 may be $In_xGa_{1-x}N$, with x between 0.03 and 0.2 (306C), while polarization layer 109 is $Al_xGa_{1-x}N$, with x between 0.1 and 0.4 (309B) to provide a suitable opposing polarization field. In this embodiment, larger fractions of In balance larger fractions of Al.

Epitaxial architectures including polarization material compositions, such as those in Table 1, may be engineered by selecting the composition of the III-N polarization material 109 to place sufficient negative charge on the Ga-face of channel semiconductor 107 absent an external field while also having suitable lattice match with the underlying or overlying III-N material to allow for the polarization material thickness $T_2$ needed to achieve a particular polarization strength. Composition of the III-N polarization material 106 may then be selected to take away sufficient negative charge from the Ga-face of channel semiconductor 107 so as to balance that placed on the channel by polarization layer material 109 (absent an external field). Composition of the III-N polarization material 109 may be further selected to ensure the balanced III-N polarization material 106 also has a suitable lattice match with the underlying or overlying III-N material to allow for the III-N polarization material thickness $T_1$ needed to provide balanced polarization fields. With $T_1$ and $T_2$ further constrained to be over a minimum thickness required for a repeatable fixed polarization field polarity (e.g., 7 nm), a bound interface density graph such as in FIG. 4 may be utilized to select a composition of polarization material 106 that, when having a minimum thickness $T_1$, can balance the polarization field of polarization material 109 also having at least the minimum thickness $T_2$. Where the polarization material 106 or 109 is sufficiently lattice matched, thickness $T_1$ and/or thickness $T_2$ may be greater, with either polarization layer having a thickness greater than the other as needed to achieve a $V_t$ target nearest 0V.

Notably, any of HFET 101, 201, or 301 may be implemented in an electronic device structure comprising a system on a chip. For example, the structure may include a silicon Complementary Metal Oxide Semiconductor (CMOS) circuit portion 102, a III-N material based device portion 103, an other device portions, implemented on a substrate. The III-N material based devices (e.g., transistor 100 or transistor 200) may be formed on III-N material regions that are formed on, over, or within the substrate. For example, the substrate may be silicon as discussed herein. The III-N material regions may be formed adjacent to CMOS circuit portions based on device requirements for example.

Although illustrated with respect to structures having lateral and/or planar channels, the techniques discussed herein may be extended to vertically oriented MOSFET devices, or multi-gate MOSFET devices. In such non-planar transistor embodiments, a gate dielectric and a gate electrode may wrap around multiple dimensions of the III-N channel semiconductor and polarization materials. Such implementations may have the advantage of stronger gate electrode coupling to the plurality of III-N polarization layers, particularly for HFET 301 where III-N polarization layers are on opposite sides of the channel semiconductor. Non-planar devices may further benefit from the use of lateral overgrowth epitaxy to form one or both of the III-N polarization layers described herein.

Figure 5:
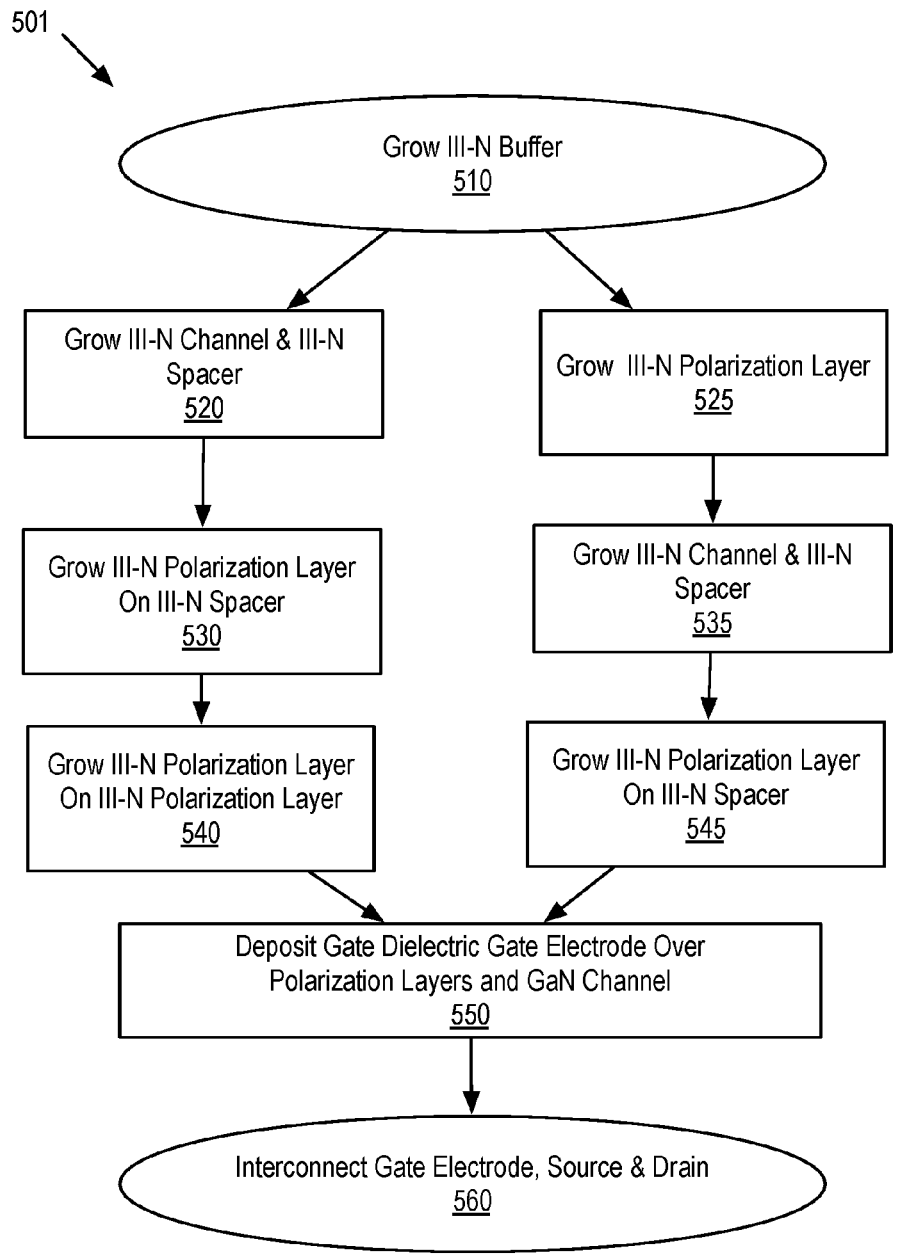
FIG. 5 is a flow diagram illustrating a method of forming a HFET with a gate stack that includes balanced and opposing III-N polarization material layers configured to achieve a steep sub-threshold slope, in accordance with embodiments.

FIG. 5 is a flow diagram illustrating a method 501 for forming a HFET with a gate stack that includes balanced and opposing III-N polarization material layers configured to achieve a steep sub-threshold slope, in accordance with embodiments. However, embodiments herein may include additional operations, certain operations may be omitted, or operations performed out of the order provided.

Method 501 begins with growing a III-N buffer, such as buffer 105 on a substrate, such as substrate 102 using any known epitaxial growth technique, such as, but not limited to, molecular beam epitaxy (MBE), or MOCVD. After growth of the III-N buffer, method 501 either further entails epitaxially growing a III-N channel semiconductor upon the buffer at operation 520, or further entails epitaxially growing a III-N polarization layer upon the buffer at operation 525. In a first embodiment, operation 520 entails growing at least a 7 nm thick GaN channel semiconductor and a AlN spacer is epitaxially grown on the GaN channel semiconductor to a thickness less than 2 nm. In a second embodiment, operation 525 entails growing at least a 4 nm thick III-N polarization layer having a first piezoelectric and spontaneous polarization field polarity. In one exemplary embodiment, operation 525 entails growing an In-rich III-N alloy having a positive bound Ga-face/GaN interface density.

Method 501 continues from operation 520 to operation 530 where at least a 4 nm III-N polarization layer having first piezoelectric and spontaneous polarization field polarity is grown on the III-N spacer. In one exemplary embodiment, operation 530 entails growing a III-N alloy having a positive bound Ga-face/GaN interface density. In an alternate embodiment, method 510 continues from operation 525 to operation 535 where at least a 7 nm thick GaN channel semiconductor is epitaxially grown on the first III-N polarization layer and a AlN spacer is epitaxially grown on the GaN channel semiconductor to a thickness less than 2 nm.

Method 501 continues from operation 530 to operation 540 where a second III-N polarization layer is epitaxially grown upon the III-N spacer to a thickness of at least 4 nm. In one exemplary embodiment, operation 540 entails epitaxially growing a III-N alloy having a negative bound Ga-face/GaN interface density. In an alternate embodiment, method 501 continues from operation 535 to operation 545 where a III-N polarization layer is grown upon a III-N spacer to a thickness of at least 4 nm. In one exemplary embodiment, operation 545 entails epitaxially growing a III-N alloy having a negative bound Ga-face/GaN interface density.

Following operations 540 or 545, the epitaxial structure including a plurality of polarization layers and a channel semiconductor as depicted in FIG. 2A or FIG. 3A may be completed by epitaxially growing a source/drain semiconductor layer using conventional techniques. A gate recess etch may be performed to expose a top III-N polarization layer and a gate dielectric and gate electrode work function metal deposited in the recess at operation 550. Alternatively, raised source/drain semiconductor may be grown subsequent to depositing a gate dielectric and gate electrode work function metal on a top III-N polarization layer. Method 501 then completes at operation 560 where interconnect metallization is deposited on the HFET gate electrode, source and drain.

Figure 6:
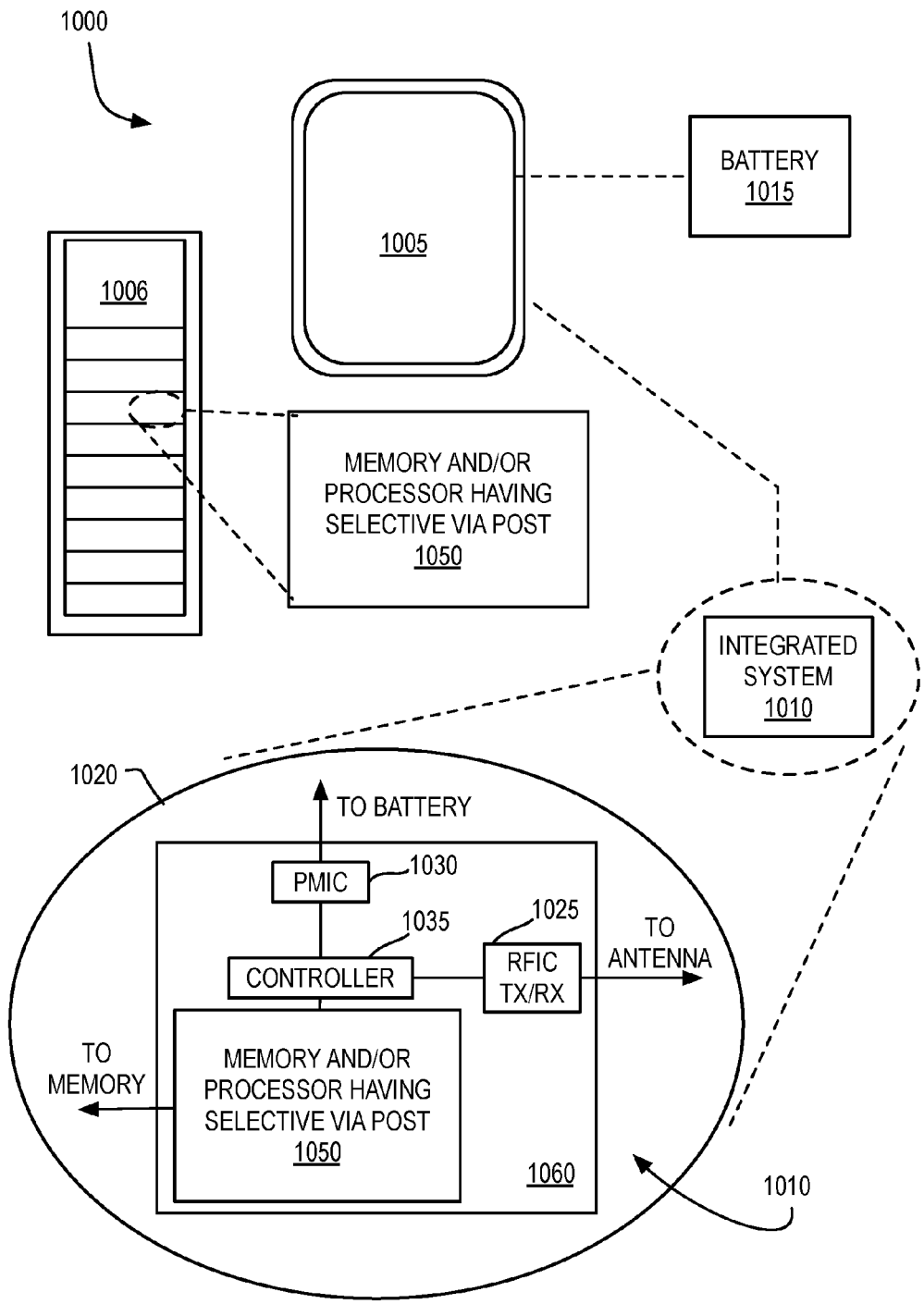
FIG. 6 illustrates a mobile computing platform and a data server machine employing a III-N HFET with steep sub-threshold slope, in accordance with embodiments of the present invention.

FIG. 6 illustrates a system 1000 in which a mobile computing platform 1005 and/or a data server machine 1006 employs an IC including at least one III-N HFET employing balanced and opposing III-N polarization materials, in accordance with embodiments of the present invention. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) including at least one III-N HFET employing balanced and opposing III-N polarization materials, for example as describe elsewhere herein. The monolithic IC 1050 may be further coupled to a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035.

Functionally, PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050.

Figure 7:
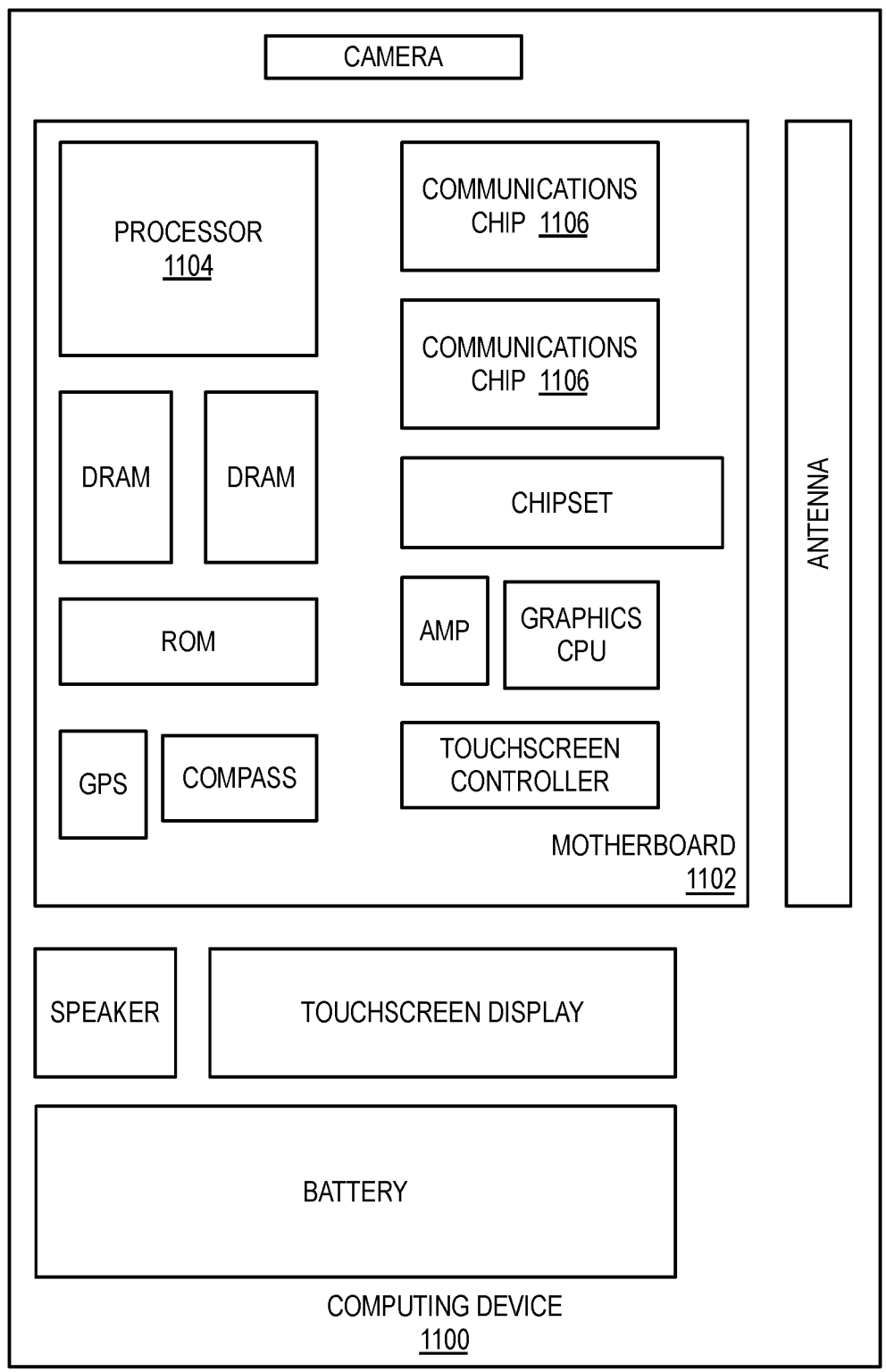
FIG. 7 is a functional block diagram of an electronic computing device, in accordance with an embodiment of the present invention.

FIG. 7 is a functional block diagram of a computing device 1100, arranged in accordance with at least some implementations of the present disclosure. Computing device 1100 may be found inside platform 1005 or server machine 1006, for example. Device 1100 further includes a motherboard 1102 hosting a number of components, such as, but not limited to, a processor 1104 (e.g., an applications processor), which may further incorporate at least one III-N HFET employing balanced and opposing III-N polarization materials in accordance with embodiments of the present invention. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiment, a heterostructure field effect transistor (HFET), includes a gate electrode, a source and a drain, and a channel semiconductor comprising GaN and electrically coupling the source and drain with a two dimensional electron gas (2DEG) coupled to the gate electrode through a gate dielectric material. The HFET further includes a plurality of group III-nitride (III-N) polarization materials proximate to the channel semiconductor that are also coupled to the gate electrode through the gate dielectric material. The plurality of III-N polarization materials further includes a first III-N material having a first polarization field with a first polarity that places negative charge at a Ga-polar interface of the channel semiconductor in the absence of an externally applied field from the gate electrode. The plurality of III-N polarization materials further includes a second III-N material having a second polarization field with a second polarity that is opposite the first polarity and is of a magnitude substantially equal to the first polarization field.

In furtherance of the one or more first embodiment, the first and second III-N polarization materials drive an order of magnitude change in current at the drain at 20° C. in response to a bias voltage of the gate electrode changing by less than 60 mV.

In furtherance of the one or more first embodiment, the first and second III-N polarization materials are disposed over the Ga-polar interface of the channel semiconductor, or the first III-N polarization material is disposed over the Ga-polar interface of the channel semiconductor and the channel semiconductor is disposed over a Ga-polar interface of the second III-N polarization material.

In furtherance of the one or more first embodiment, the first and second III-N polarization materials are disposed over the Ga-polar interface of the channel semiconductor. The first and second III-N polarization materials drive an order of magnitude increase in current at the drain at 20° C. in response to a bias voltage of the gate electrode increasing by less than 60 mV towards 0V. The first and second III-N polarization materials drive an order of magnitude decrease in current at the drain at 20° C. in response to a change in a bias voltage of the gate electrode decreasing by less than 60 mV towards 0V.

In furtherance of the one or more first embodiment, the channel semiconductor forms a heterojunction with a Ga-polar interface of the second III-N polarization material. The first and second III-N polarization materials drive an order of magnitude increase in current at the drain at 20° C. in response to a change in a bias voltage of the gate electrode increasing by less than 60 mV from 0V. The first and second III-N polarization materials drive an order of magnitude decrease in current at the drain at 20° C. in response to a change in a bias voltage of the gate electrode decreasing by less than 60 mV from 0V.

In furtherance of the above embodiment, the first III-N polarization material forms a heterojunction with a Ga-polar interface of an AlN spacer layer, and the AlN spacer layer forms a heterojunction with the Ga-polar interface of the channel semiconductor.

In furtherance of the one or more first embodiment, the first III-N polarization material comprises $Al_xIn_{1-x}N$, with x between 0.8 and 1. The second III-N polarization material comprises $Al_xIn_{1-x}N$, with x between 0.6 to 0.4, or $In_xGa_{1-x}N$ with x between 0.2 to 0.5. Alternatively, the first III-N polarization material comprises $Al_xGa_{1-x}N$ with x between 0.1 to 0.4, and the second III-N polarization material comprises $In_xGa_{1-x}N$, with x between 0.03 to 0.2.

In furtherance of the above embodiment, the threshold voltage ($V_t$) displays a hysteresis with no more than 200 mV shift between increasing and decreasing gate electrode voltage sweeps that pass through 0V.

Also in furtherance of the above embodiment, film thicknesses of the first III-N polarization material is within 10% of the film thickness of the second III-N polarization material.

Also in furtherance of the above embodiment, the first and second III-N polarization materials each have a film thickness of at least 4 nm and no more than 20 nm; and the channel semiconductor is at least 10 nm in thickness. In furtherance of this embodiment, an AlN layer spaces the first III-N material layer from the channel layer by less than 2 nm, the gate electrode comprises a mid-gap or to slightly p-type metal, and the gate dielectric comprises $Al_2O_3$, $HfO_2$, $TaSi_yO_x$, $Ta_2O_5$, $ZrO_2$.

In one or more second embodiment, a III-N epitaxial stack includes a substrate, a semiconductor buffer layer disposed on the substrate, a Ga-polar GaN layer disposed over the buffer, and a plurality of group III-nitride (III-N) polarization materials proximate to the GaN layer. The plurality of III-N polarization materials further includes a first III-N material having a first polarization field with a first polarity that places negative charge at a Ga-polar interface of the GaN layer in the absence of an externally applied field, and a second III-N material having a second polarization field with a second polarity that is opposite the first polarity and is of a magnitude substantially equal to the first polarization field.

In furtherance of the one or more second embodiment, the first III-N polarization material forms a heterojunction with a Ga-polar interface of an AlN spacer layer. The AlN spacer layer forms a heterojunction with the Ga-polar interface of the GaN layer. The GaN layer forms a heterojunction with a Ga-polar interface of the second III-N polarization material.

In furtherance of the one or more second embodiment, the first III-N polarization material includes $Al_xIn_{1-x}N$, with x between 0.8 and 1, and the second III-N polarization material includes $Al_xIn_{1-x}N$, with x between 0.6 to 0.4; or $In_xGa_{1-x}N$ with x between 0.2 to 0.5. Alternatively, the first III-N polarization material includes $Al_xGa_{1-x}N$ with x between 0.1 to 0.4, and the second III-N polarization material includes $In_xGa_{1-x}N$, with x between 0.03 to 0.2.

In furtherance of the above embodiment, film thicknesses of the first III-N polarization material is within 10% of the film thickness of the second III-N polarization material.

In furtherance of the above embodiment, the first and second III-N polarization materials each have a film thickness of at least 4 nm and no more than 20 nm. The GaN layer has a thickness of no more than 10 nm. A AlN layer spaces the first III-N material layer from the channel layer by less than 2 nm.

In one or more fourth embodiment, a heterostructure field effect transistor (HFET), includes a gate electrode, a source and a drain, and a channel semiconductor comprising GaN and electrically coupling the source and drain with a two dimensional electron gas (2DEG) coupled to the gate electrode through a dielectric layer having a bulk dielectric constant of 7 or more. The HFET further includes a plurality of group III-nitride (III-N) polarization material layers proximate to the channel semiconductor and also coupled to the gate electrode through the dielectric. The plurality of III-N polarization material layers further includes a first III-N material spaced apart from the channel semiconductor by an AlN layer and having a first polarization field with a first polarity that places negative charge at a Ga-polar interface of the channel semiconductor in the absence of an externally applied field from the gate electrode. The plurality of III-N polarization material layers further includes a second III-N material disposed on an opposite side of the channel semiconductor as the first III-N polarization layer and having a second polarization field with a second polarity that is opposite the first polarity and substantially removes the negative charge at a Ga-polar interface of the channel layer in the absence of an externally applied field from the gate electrode.

In furtherance of the one or more fourth embodiment, the first III-N polarization material layer forms a heterojunction with a Ga-polar interface of the AlN spacer layer. The AlN spacer layer forms a heterojunction with the Ga-polar interface of the GaN layer, and the GaN layer forms a heterojunction with a Ga-polar interface of the second III-N polarization material layer.

In furtherance of the one or more fourth embodiment, the first III-N polarization material includes $Al_xIn_{1-x}N$, with x between 0.8 and 1, and the second III-N polarization material includes $Al_xIn_{1-x}N$, with x between 0.6 to 0.4, or $In_xGa_{1-x}N$ with x between 0.2 to 0.5. Alternatively, the first III-N polarization material comprises $Al_xGa_{1-x}N$ with x between 0.1 to 0.4, and the second III-N polarization material comprises $In_xGa_{1-x}N$, with x between 0.03 to 0.2.

In furtherance of the above embodiment, film thicknesses of the first III-N polarization material is within 10% of the film thickness of the second III-N polarization material.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A heterostructure field effect transistor (HFET), comprising:
   a gate electrode;
   a source and a drain;
   a channel semiconductor comprising GaN and electrically coupling the source and drain with a two dimensional electron gas (2DEG) coupled to the gate electrode through a gate dielectric material; and
   a plurality of group III-nitride (III-N) polarization materials proximate to the channel semiconductor and also coupled to the gate electrode through the gate dielectric material, wherein the plurality of III-N polarization materials further comprises:
      a first III-N material having a first polarization field with a first polarity that places negative charge at a Ga-polar interface of the channel semiconductor in the absence of an externally applied field from the gate electrode; and
      a second III-N material having a second polarization field with a second polarity that is opposite the first polarity and is of a magnitude substantially equal to the first polarization field.

2. The HFET of claim 1, wherein:
   the first and second III-N polarization materials drive an order of magnitude change in current at the drain at 20° C. in response to a bias voltage of the gate electrode changing by less than 60 mV.

3. The HFET of claim 2, wherein:
   the first and second III-N polarization materials are disposed over the Ga-polar interface of the channel semiconductor; or
   the first III-N polarization material is disposed over the Ga-polar interface of the channel semiconductor and the channel semiconductor is disposed over a Ga-polar interface of the second III-N polarization material.

4. The HFET of claim 3, wherein
   the first and second III-N polarization materials are disposed over the Ga-polar interface of the channel semiconductor; and
   the first and second III-N polarization materials drive an order of magnitude increase in current at the drain at 20° C. in response to a bias voltage of the gate electrode increasing by less than 60 mV towards 0V; and
   the first and second III-N polarization materials drive an order of magnitude decrease in current at the drain at 20° C. in response to a change in a bias voltage of the gate electrode decreasing by less than 60 mV towards 0V.

5. The HFET of claim 3, wherein:
   the channel semiconductor forms a heterojunction with a Ga-polar interface of the second III-N polarization material; and
   the first and second III-N polarization materials drive an order of magnitude increase in current at the drain at 20° C. in response to a change in a bias voltage of the gate electrode increasing by less than 60 mV from 0V; and
   the first and second III-N polarization materials drive an order of magnitude decrease in current at the drain at 20° C. in response to a change in a bias voltage of the gate electrode decreasing by less than 60 mV from 0V.

6. The HFET of claim 5, wherein:
   the first III-N polarization material forms a heterojunction with a Ga-polar interface of an AlN spacer layer; and
   the AlN spacer layer forms a heterojunction with the Ga-polar interface of the channel semiconductor.

7. The HFET of claim 1, wherein:
   the first III-N polarization material comprises $Al_xIn_{1-x}N$, with x between 0.8 and 1; and
   the second III-N polarization material comprises:
      $Al_xIn_{1-x}N$, with x between 0.6 to 0.4; or
      $In_xGa_{1-x}N$ with x between 0.2 to 0.5; or
   the first III-N polarization material comprises $Al_xGa_{1-x}N$ with x between 0.1 to 0.4, and the second III-N polarization material comprises $In_xGa_{1-x}N$, with x between 0.03 to 0.2.

8. The HFET of claim 7, wherein the threshold voltage ($V_t$) displays a hysteresis with no more than 200 mV shift between increasing and decreasing gate electrode voltage sweeps that pass through 0V.

9. The HFET of claim 7, wherein film thicknesses of the first III-N polarization material is within 10% of the film thickness of the second III-N polarization material.

10. The HFET of claim 7, wherein:
    the first and second III-N polarization materials each have a film thickness of at least 4 nm and no more than 20 nm; and
    the channel semiconductor is at least 10 nm in thickness.

11. The HFET of claim 10, further comprising an AlN layer spacing the first III-N material layer from the channel layer by less than 2 nm; and
    wherein:
       the gate electrode comprises a mid-gap or to slightly p-type metal; and
       the gate dielectric comprises $Al_2O_3$, $HfO_2$, $TaSi_yO_x$, $Ta_2O_5$, $ZrO_2$.

12. A III-N epitaxial stack comprising:
    a substrate;
    a semiconductor buffer layer disposed on the substrate;
    a Ga-polar GaN layer disposed over the buffer; and
    a plurality of group III-nitride (III-N) polarization materials proximate to the GaN layer;
    wherein the plurality of III-N polarization materials further comprises:
       a first III-N material having a first polarization field with a first polarity that places negative charge at a Ga-polar interface of the GaN layer in the absence of an externally applied field; and
       a second III-N material having a second polarization field with a second polarity that is opposite the first polarity and is of a magnitude substantially equal to the first polarization field.

13. The III-N epitaxial stack of claim 12, wherein:
    the first III-N polarization material forms a heterojunction with a Ga-polar interface of an AlN spacer layer;
    the AlN spacer layer forms a heterojunction with the Ga-polar interface of the GaN layer; and
    the GaN layer forms a heterojunction with a Ga-polar interface of the second III-N polarization material.

14. The III-N epitaxial stack of claim 12, wherein:
the first III-N polarization material comprises $Al_xIn_{1-x}N$, with x between 0.8 and 1; and
the second III-N polarization material comprises:
$Al_xIn_{1-x}N$, with x between 0.6 to 0.4; or
$In_xGa_{1-x}N$ with x between 0.2 to 0.5; or
the first III-N polarization material comprises $Al_xGa_{1-x}N$ with x between 0.1 to 0.4, and the second III-N polarization material comprises $In_xGa_{1-x}N$, with x between 0.03 to 0.2.

15. The III-N epitaxial stack of claim 14, wherein film thicknesses of the first III-N polarization material is within 10% of the film thickness of the second III-N polarization material.

16. The III-N epitaxial stack of claim 14, wherein:
the first and second III-N polarization materials each have a film thickness of at least 4 nm and no more than 20 nm;
the GaN layer has a thickness of no more than 10 nm; and
a AlN layer spaces the first III-N material layer from the channel layer by less than 2 nm.

17. A heterostructure field effect transistor (HFET), comprising:
a gate electrode;
a source and a drain;
a channel semiconductor comprising GaN and electrically coupling the source and drain with a two dimensional electron gas (2DEG) coupled to the gate electrode through a dielectric layer having a bulk dielectric constant of 7 or more; and
a plurality of group III-nitride (III-N) polarization material layers proximate to the channel semiconductor and also coupled to the gate electrode through the dielectric, wherein the plurality of III-N polarization material layers further comprises:
a first III-N material spaced apart from the channel semiconductor by an AlN layer and having a first polarization field with a first polarity that places negative charge at a Ga-polar interface of the channel semiconductor in the absence of an externally applied field from the gate electrode; and
a second III-N material disposed on an opposite side of the channel semiconductor as the first III-N polarization layer and having a second polarization field with a second polarity that is opposite the first polarity and substantially removes the negative charge at a Ga-polar interface of the channel layer in the absence of an externally applied field from the gate electrode.

18. The HFET of claim 17, wherein the first III-N polarization material layer forms a heterojunction with a Ga-polar interface of the AlN spacer layer;
the AlN spacer layer forms a heterojunction with the Ga-polar interface of the GaN layer; and
the GaN layer forms a heterojunction with a Ga-polar interface of the second III-N polarization material layer.

19. The HFET of claim 17, wherein:
the first III-N polarization material comprises $Al_xIn_{1-x}N$, with x between 0.8 and 1; and
the second III-N polarization material comprises:
$Al_xIn_{1-x}N$, with x between 0.6 to 0.4; or
$In_xGa_{1-x}N$ with x between 0.2 to 0.5; or
the first III-N polarization material comprises $Al_xGa_{1-x}N$ with x between 0.1 to 0.4, and the second III-N polarization material comprises $In_xGa_{1-x}N$, with x between 0.03 to 0.2.

20. The HFET of claim 19, wherein film thicknesses of the first III-N polarization material is within 10% of the film thickness of the second III-N polarization material.

* * * * *